United States Patent
Chen et al.

(10) Patent No.: US 11,017,966 B2
(45) Date of Patent: *May 25, 2021

(54) KEY STRUCTURE CONVERTIBLE BETWEEN DIGITAL AND ANALOG SWITCH MODES AND SWITCHING METHOD THEREOF

(71) Applicant: Acer Incorporated, New Taipei (TW)

(72) Inventors: Hung-Chi Chen, New Taipei (TW);
Yung-Cheng Teng, New Taipei (TW);
Chen-Chih Hou, New Taipei (TW);
Cheng-Han Lin, New Taipei (TW);
Yung-Hui Hou, New Taipei (TW)

(73) Assignee: Acer Incorporated, New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/874,624

(22) Filed: May 14, 2020

(65) Prior Publication Data

US 2020/0273643 A1 Aug. 27, 2020

Related U.S. Application Data

(63) Continuation of application No. 16/354,152, filed on Mar. 14, 2019, now Pat. No. 10,714,281.

(30) Foreign Application Priority Data

Dec. 5, 2018 (TW) ................................. 107143627

(51) Int. Cl.
*H01H 13/7065* (2006.01)
*H01H 13/83* (2006.01)
*H03K 17/968* (2006.01)

(52) U.S. Cl.
CPC ........ *H01H 13/7065* (2013.01); *H01H 13/83* (2013.01); *H03K 17/968* (2013.01);
(Continued)

(58) Field of Classification Search
CPC .. H01H 13/83; H01H 13/702; H01H 13/7065; H01H 2239/022; H01H 2239/05;
(Continued)

(56) References Cited

U.S. PATENT DOCUMENTS

| 7,238,908 B1 * | 7/2007 | Chen ...................... | H01H 3/125 |
| | | | 200/344 |
| 10,394,341 B1 * | 8/2019 | Wang ...................... | G06F 3/021 |
| 10,680,611 B2 * | 6/2020 | Li ........................ | H01H 13/705 |

* cited by examiner

*Primary Examiner* — Vanessa Girardi
(74) *Attorney, Agent, or Firm* — JCIPRNET (57) ABSTRACT

A key structure including a circuit board, a membrane, a positioning frame, a sensor module, a scissor leg, and a key cap is provided. The membrane is disposed on the circuit board and is electrically connected to each other. The positioning frame is disposed on the membrane. The sensor module is disposed on the membrane and is electrically connected to the circuit board. The scissor leg is connected to the positioning frame and is adapted to move up and down relative to the positioning frame. The key cap is detachably disposed at the scissor leg and is spaced with positioning frame. The key cap has a reflective plane and a shaft component. The reflective plane faces the membrane. The shaft component is extended from the reflective plane and penetrates through the scissor leg and the positioning frame to abut the membrane. The sensor module is aligned with the reflective plane.

7 Claims, 8 Drawing Sheets

(52) U.S. Cl.
CPC ... *H01H 2239/022* (2013.01); *H01H 2239/05* (2013.01); *H03K 2217/94108* (2013.01); *H03K 2217/965* (2013.01)

(58) Field of Classification Search
CPC .. G06F 3/0304; H03K 17/968; H03K 17/969; H03K 17/943; H03K 2217/96023; H03K 2217/941; H03K 2217/94108
See application file for complete search history.

KEY STRUCTURE CONVERTIBLE BETWEEN DIGITAL AND ANALOG SWITCH MODES AND SWITCHING METHOD THEREOF

CROSS-REFERENCE TO RELATED APPLICATION

This application is a continuation application and claims the priority benefit of U.S. application Ser. No. 16/354,152, filed on Mar. 14, 2019, now allowed, which claims the priority benefit of Taiwan application serial no. 107143627, filed on Dec. 5, 2018. The entirety of each of the above-mentioned patent applications is hereby incorporated by reference herein and made a part of this specification.

BACKGROUND

Technical Field

The disclosure relates to a key of a notebook computer, and in particular to a key structure of a switchable digital control signal and an analog control signal and a mode switching method thereof.

Description of Related Art

A notebook computer applied to electronic sports nowadays allows a player to play games mainly through controlling input devices such as a mouse and a keyboard. Compared to a desktop computer, the notebook computer is lighter and more portable, allowing the player to start games with an external mouse; wherein the keyboard of the notebook computer is built-in, and each key input a digital signal through a finger press of the user, triggering the two signals of ON and OFF respectively when the keys are pressed and are not pressed.

However, existing keys nowadays are mostly digital keys and can only input the ON/OFF signal without implementing a continuous function signal of an analog key. Briefly, the analog key may sense the level of the user's press strength in a certain deformation range and transform the strength into a corresponding numerical value in the game to make the control of the game more closed to reality.

For instance, in a car-racing game, when the user controls a racing car through digital keys, the throttle of the racing car only has to states of "full-open" (ON signal) and "full-closed" (OFF signal). As a comparison, when the user controls the throttle of the racing car with analog keys, the game program may transform the press into a corresponding throttle response according to the level of the depth of the press to the analog key.

Thus, to experience the gameplay of an analog control, the existing users need to install an extra analog joystick or an analog key. However, the extra installation contradicts the effects and purposes of lightness and portability of the notebook computer. Also, the installation may not be compatible with the mouse easily.

SUMMARY

The disclosure provides a key structure and a mode switch method thereof, allowing the key structure to switch between an analog mode and a digital mode freely, and thus possesses broad practicability.

The key structure of the disclosure includes a circuit board, a membrane, a positioning frame, a sensor module, a scissor leg and a key cap. The membrane is disposed on the circuit board and is electrically connected to each other. The positioning frame is disposed on the membrane. The sensor module is disposed on the membrane and is electrically connected to the circuit board. The scissor leg is connected to the positioning frame and is adapted to move up and down relative to the positioning frame. The key cap is detachably disposed at the scissor leg and is spaced with the positioning frame. The key cap has a reflective plane and a shaft component. The reflective plane faces the membrane. The shaft component is extended from the reflective plane and penetrates through the scissor leg and the positioning frame to abut the membrane. The sensor module is aligned with the reflective plane; wherein the sensor module is adapted to detect a press stroke of the key cap relative to the membrane; when the key cap is pressed, a digital control signal or an analog control signal is triggered through the membrane or the sensor module.

The mode switching method of the disclosure includes a key structure including a circuit board, a membrane, a position frame, a sensor module, a scissor leg and a key cap. The membrane is disposed on the circuit board and is electrically connected to each other. The positioning frame is disposed on the membrane. The sensor module is disposed on the membrane and is electrically connected to the circuit board. The scissor leg is connected to the positioning frame and is adapted to move up and down relative to the positioning frame. A key cap having a elastic component is disposed at the scissor leg, making the elastic component abut the membrane to switch on the digital mode. When the key cap is pressed, the elastic component generates a non-linear deformation to squeeze the membrane to further trigger a digital control signal. The key cap having the elastic component is replaced by another key cap having an elastic component to make the elastic component abut the membrane to switch on the analog mode. When the key cap is pressed, the elastic component generates a linear deformation to further trigger an analog control signal through a press stoke of the key cap relative to the membrane detected by the sensor module.

Based on the above, the key structure of the disclosure may freely replace the key cap having different shaft components. When the user presses the key cap, the corresponding digital control signal or analog control signal may be triggered through the membrane or the sensor module. Therefore, the key structure may be switched to the digital mode (suitable for word processing and web page browsing) and to the analog mode (suitable for electronic sports and game controlling) according to the user's requirement. Thus, compared to the keyboard of the notebook computer, the key structure of the disclosure has broad practicability.

Further, the key structure of the disclosure may achieve the function of switching between the digital and analog modes through only replacing the key cap; compared to the method of using an existing external analog joystick, the key structure has advantages of detachability and easy portability; also, the scenario of the incompatibility between the analog joystick and the mouse may be avoided.

In order to make the features and advantages of the disclosure mentioned above more understandable, embodiments will be described in detail below with reference to the accompanying drawings.

DESCRIPTION OF THE EMBODIMENTS

Figure 1:
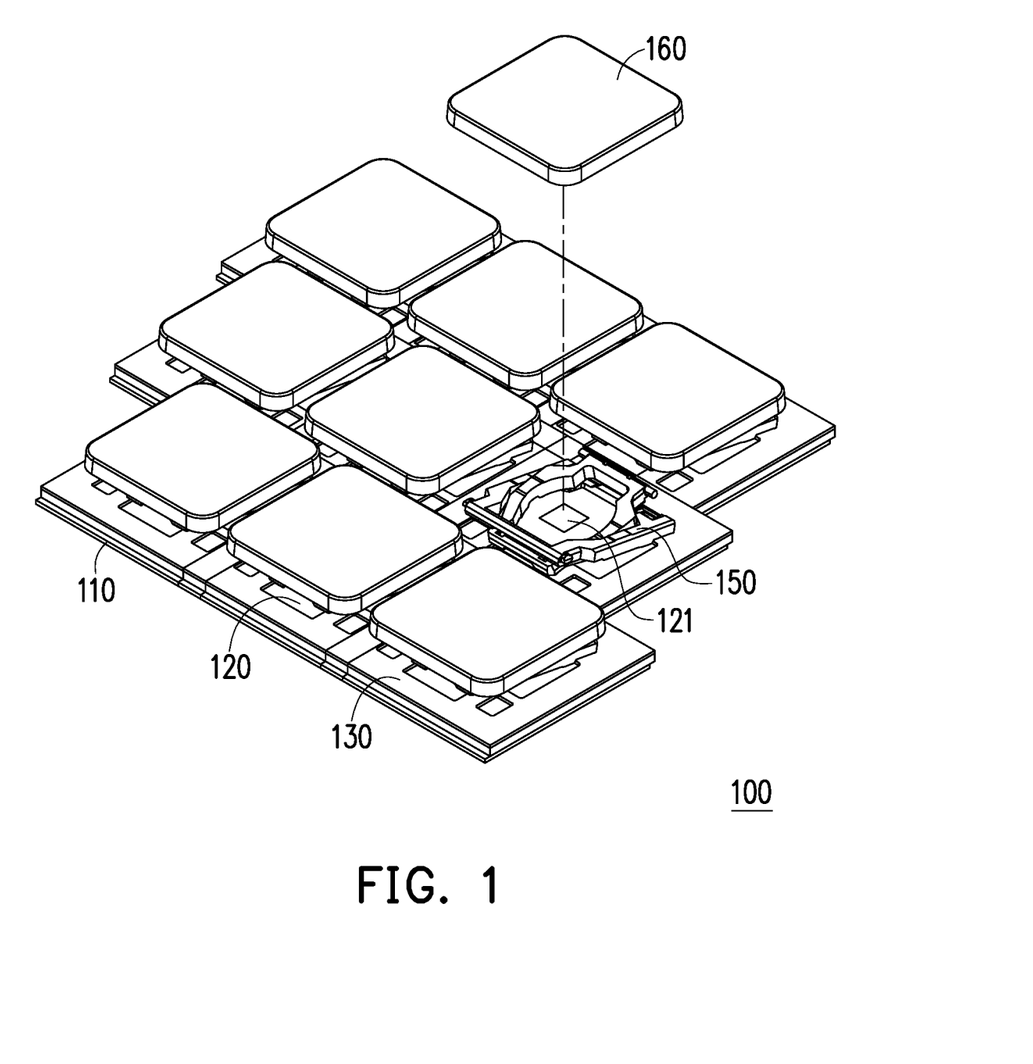
FIG. 1 is an exploded perspective view of a key structure according to an embodiment of the disclosure.
Figure 2A:
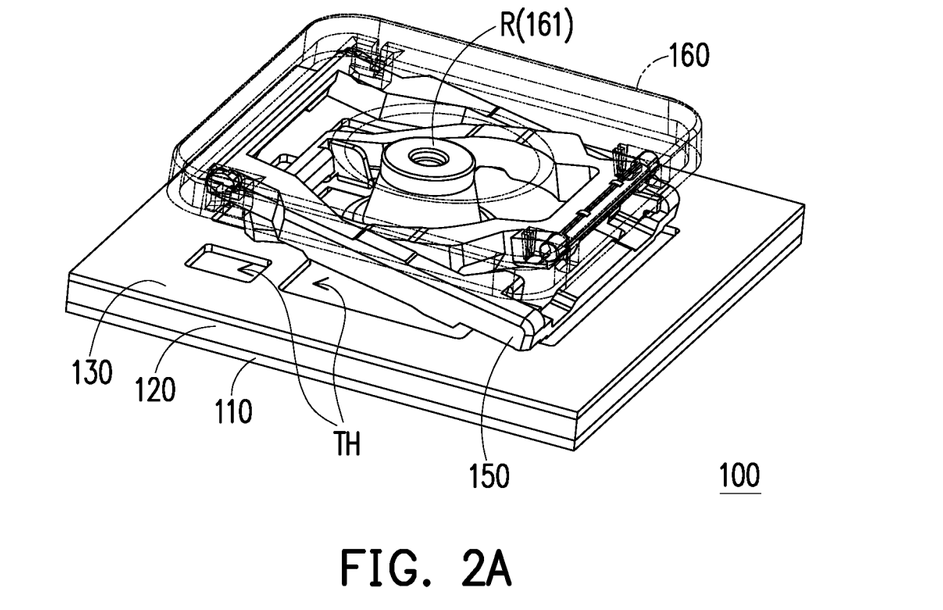
FIG. 2A is a perspective see-through schematic view of a key cap having a elastic component and installed on the key structure of FIG. 1.
Figure 3A:
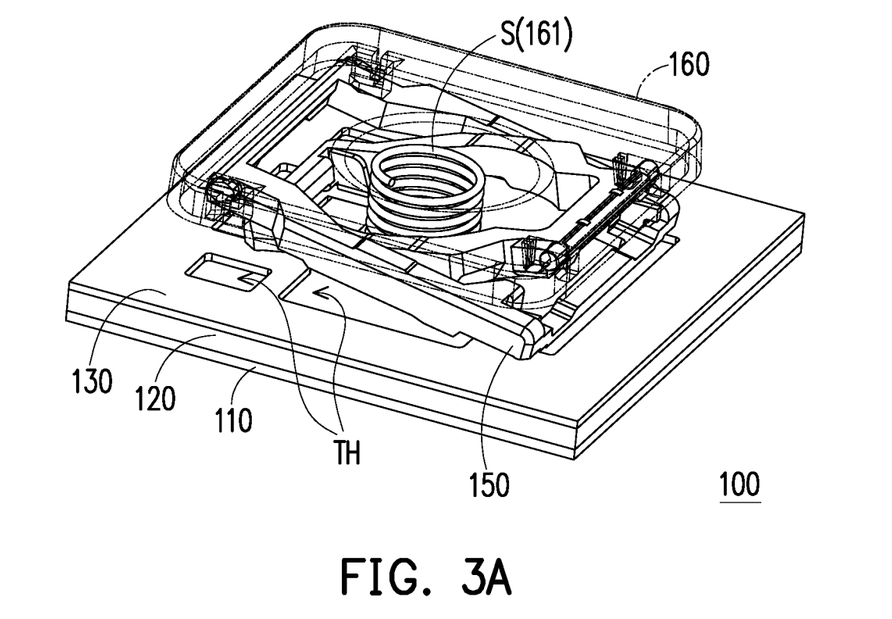
FIG. 3A is a perspective see-through schematic view of the key cap having an elastic component and installed on the key structure of FIG. 1.

FIG. 1 is an exploded perspective view of a key structure according to an embodiment of the disclosure. FIG. 2A is a perspective see-through schematic view of a key cap having an elastic component and installed on the key structure of FIG. 1. FIG. 3A is a perspective see-through schematic view of the key cap having an elastic component and installed on the key structure of FIG. 1.

Please refer to FIG. 1. A key structure 100 of the disclosure applies to a built-in keyboard of a notebook computer. In another embodiment, the key structure of the disclosure may be applied to an external keyboard of a desktop computer. Generally, an existing keyboard has a plurality of key structures, and each key structure respectively represent to different orders. When each key structure is not pressed, the judgement of a keyboard system is OFF, and the order is not triggered. When each press structure is pressed, the judgement of the keyboard system is ON, and a corresponding order is triggered to achieve actions such as inputting characters, controlling games or executing programs. Briefly, existing keyboards are mostly the digital modes judging ON/OFF signals.

Please refer to FIG. 1, FIG. 2A and FIG. 3A. The key structure 100 of the disclosure includes a circuit board 110, a membrane 120, a positioning frame 130, a sensor module 140, a scissor leg 150 and a key cap 160.

The circuit board 110 is used to form a required conductor pattern and is installed on each kind of electronic component to perform digital logic judgement. The external circuit board 110 is adapted to be electrically connected to a control core of a computer, and may transmit the judged signals and orders to the control core of the computer. In the present embodiment, the circuit board 110, for example, adopts a printed circuit board or a flexible printed circuit board (FPC), which is determined by the requirement of the manufacturing process; and the disclosure is not limited hereto.

The membrane 120 is disposed on the circuit board 110 and the circuit board 110 is electrically connected to each other. The membrane 120 has a plurality of trigger buttons 121. When each trigger button 121 is pressed and deformed, an electrical signal is triggered and the electrical signal is transformed to a corresponding order after the logic judgment through the circuit board 110.

The positioning frame 130 is disposed on the membrane 120. In the present embodiment, the positioning frame 130 adopts, for example, metal, plastic, or other materials that may integrally formed.

The sensor module 140 is disposed on the membrane 120 and is electrically connected to the circuit board 110. The sensor module 140 detects sensor components of long and short distances through, for example, light source, ultrasonic, or other similar means and a continuous change of long and short distances transforms into a corresponding electrical signal.

The scissor leg 150 is connected to the positioning frame 130 and is adapted to move up and down relative to the positioning frame 130. The key cap 160 may be detachably disposed at the scissor leg and is spaced with the position frame 130, which explains that the key cap 160 may move up and down vertically along with the scissor leg 150.

Further, the key cap 160 has a reflective plane RS and a shaft component 161. The reflective plane RS is disposed to the bottom of the key cap 160 and faces the membrane 120. The shaft component 161 is extended downward from the reflective plane RS and penetrates through the scissor leg 150 and the positioning frame 130 to abut the membrane. Moreover, the sensor module 140 is aligned with the reflective plane RS and is not blocked by the positioning frame 130 and the scissor leg 150, so as to avoid affecting the judgement of the sensor module 140 toward the distances. Besides, the reflective plane RS is, for example, opaque and is favorable for reflecting light.

Figure 2B:
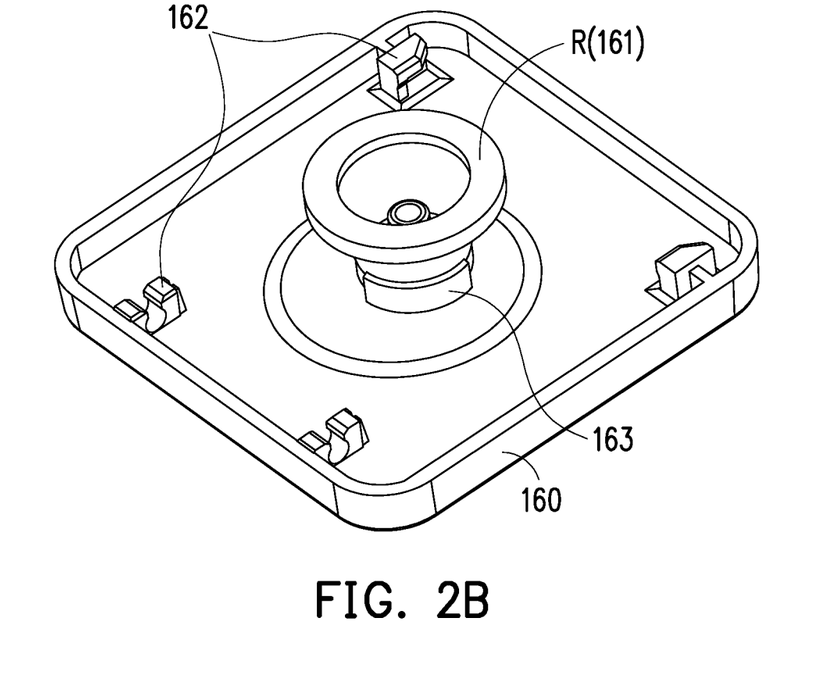
FIG. 2B is a perspective schematic view of the key cap having a elastic component of FIG. 2A.
Figure 2C:
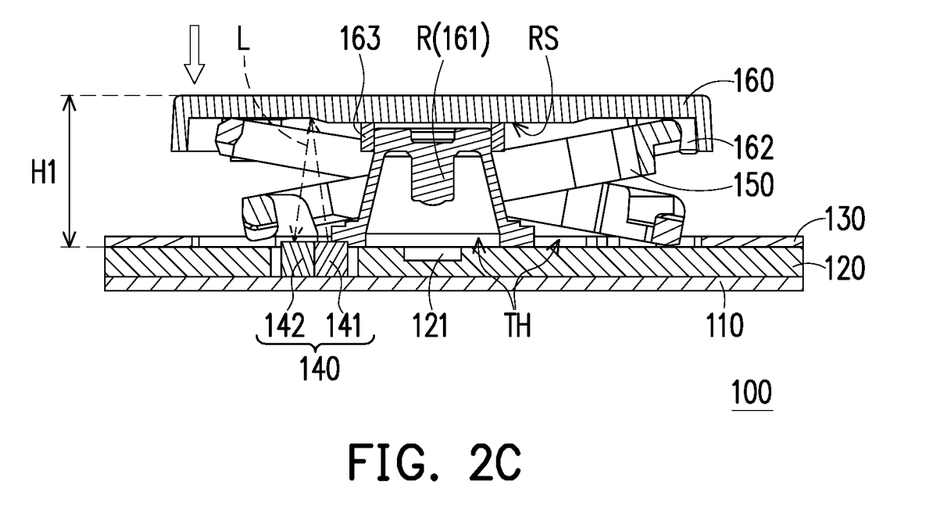
FIG. 2C and FIG. 2D are sectional schematic views of a press action of the key structure of FIG. 2A.
Figure 2D:
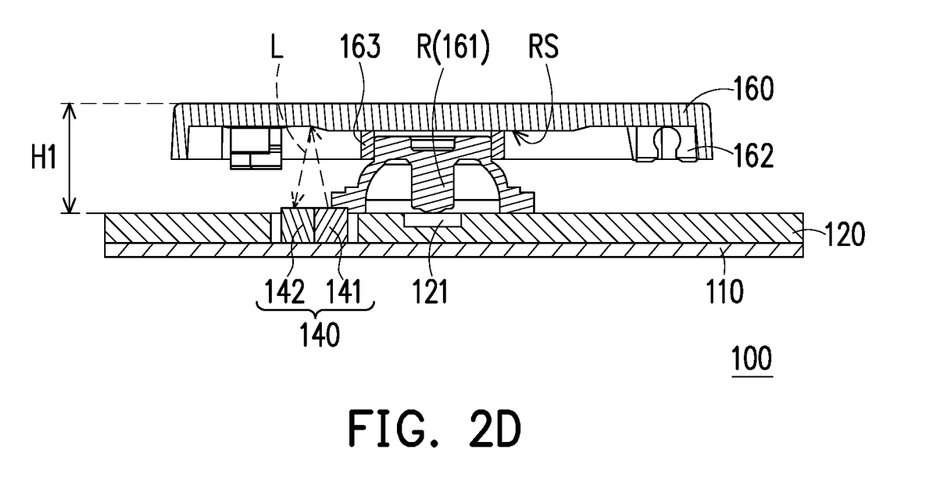
Figure 3B:
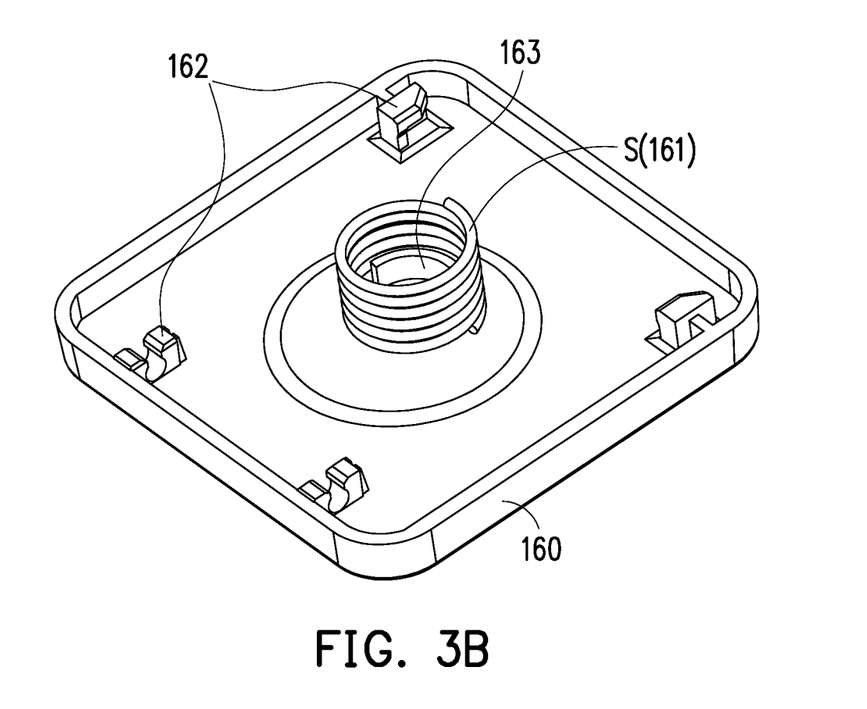
FIG. 3B is a perspective schematic view of the key cap having an elastic component of FIG. 3A.
Figure 3C:
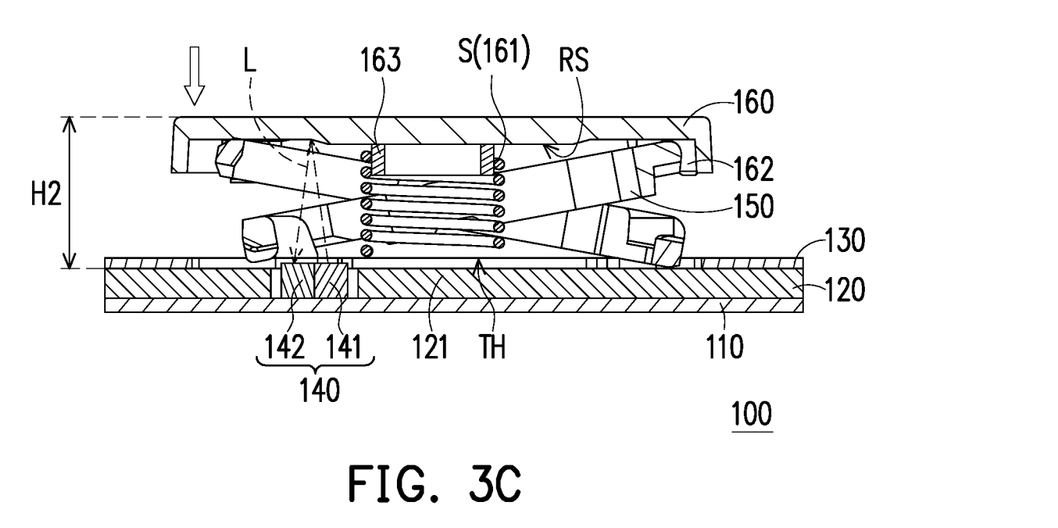
FIG. 3C and FIG. 3D is a sectional schematic view of the press action of the key structure of FIG. 3A.
Figure 3D:
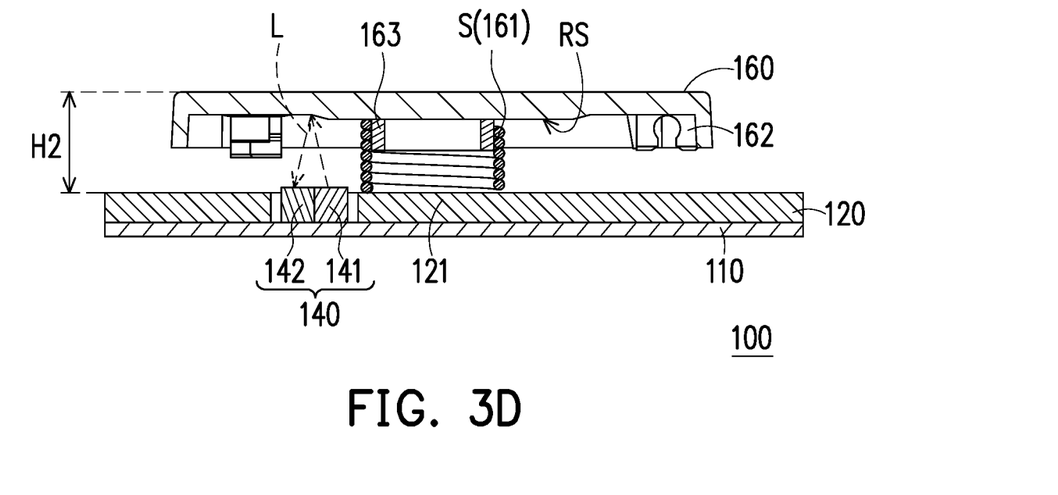

FIG. 2B is a perspective schematic view of the key cap having an elastic component of FIG. 2A. FIG. 2C and FIG. 2D are sectional schematic views of a press action of the key structure of FIG. 2A. FIG. 3B is a perspective schematic view of the key cap having elastic component of FIG. 3A. FIG. 3C and FIG. 3D is a sectional schematic view of the press action of the key structure of FIG. 3A.

Wherein the sensor module 140 is adapted to detect a press stroke H1 of the key cap 160 relative to the membrane 120. When pressing the key cap 160 towards the membrane 120, the shaft component 161 of the key cap 160 is adapted to squeeze the trigger button 121 of the membrane 120 and generates a deformation to further trigger the digital control signal; or, when pressing the key cap 160 towards the membrane 120, the sensor module 140 triggers the corresponding analog control signal by transforming the continuous change of the press stroke H1 of the key cap 160.

Please refer to FIGS. 1, 2A and 2B. The positioning frame 130 has a plurality of hook portions, and the key cap 160 has a plurality of clamp portions 162. The plurality of hook portions hook up one end of the scissor leg 150 away from the key cap 160; and the a plurality of clamp portions 162 clamp the other end of the scissor leg 150 away from the positioning frame 130, making the scissor leg 150 limited by the positioning frame 130 and the key cap 160 to have a certain range of up and down movement.

Further, the positioning frame 130 has a plurality of holes TH corresponding to the reflective plane RS of the key cap 160 and contains parts of the shaft components 161 and the sensor module 140.

Please refer to FIGS. 1, 3A and 3C. The sensor module 140 includes a light emitting device 141 and a light detector 142.

The light emitting device 141 is, for example, a light emitting diode (LED), and is adapted to transmit a light source L to the reflective plane RS of the key cap 160; and parts of the light source L is transmitted to the light detector 142 after the reflection of the reflective plane RS. The light detector 142 is adapted to receive and detect the light intensity after the reflection of the light source L. The change of the light intensity is used to judge the size of the press stroke of the key cap 160; and the change of the light intensity is transformed into a corresponding analog control signal.

Please refer to FIG. 2A to FIG. 2D. The shaft component 161 of the key cap 160 includes an elastic component R abutting the membrane 120 and the reflective plane RS respectively, and is adjacent to the sensor module 140. When the key cap 160 is pressed towards the membrane 120, the elastic component R is driven to generate a non-linear deformation; wherein an initial value of a press stroke H1 of the key cap 160 relative to the membrane 120 is 2.2 mm, which is a scenario that the key cap 160 is not pressed by external force.

Please refer to FIG. 3A to FIG. 3D. The shaft component 161 of another key cap 160 includes an elastic component S respectively abutting the membrane 120 and the reflective plane RS and being adjacent to the sensor module 140. When the key cap 160 is pressed towards the membrane 120, the elastic component S is driven to generate a linear deformation. An initial value of a press stroke H2 of the key cap 160 relative to the membrane 120 is 2.8 mm, which is a scenario that the key cap 160 is not pressed by an external force.

For example, the weaker the spectral intensity received by the light detector 142 is, the larger the press stroke H2 of the key cap 160 is, which explains that the key cap 160 is relatively away from the membrane 120; on the contrary, the stronger the spectral intensity received by the light detector 142 is, the smaller the press stroke H2 of the key cap 160 is, which explains that the key cap 160 is relatively closed to the membrane 120. Therefore, with the difference of the press stroke H2, the control of the press in different level is implemented.

Please refer to FIG. 2B and FIG. 3B. The key cap 160 has a plurality of fixed portions 163 disposed on a central position of the reflective plane RS; and the shaft component 161 and the fixed portion 163 are engaged with each other. Further, one end portion of the elastic component R is disposed among the plurality of fixed portions to contact the inner wall surface IS of the plurality of fixed portions 163 to implement the engaging relation. One end portion of the elastic component S surrounds the periphery of the plurality of fixed portions 163, and a gap of the elastic component S contains the bumps of the plurality of fixed portions 163 to implement the engaging relations.

Figure 4:
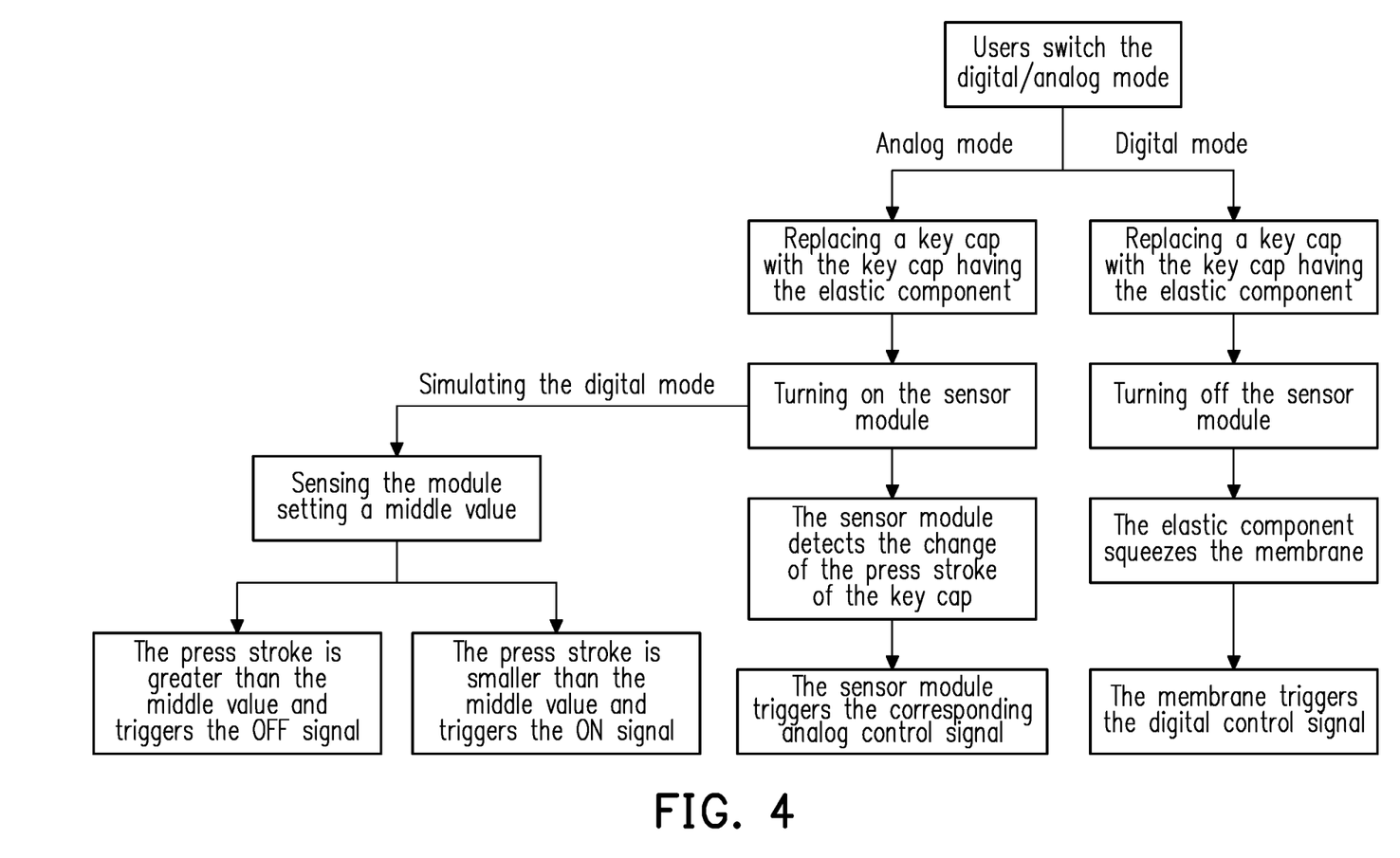
FIG. 4 is a block flow diagram of the key structure switching to a digital mode and an analog mode according to the disclosure.

FIG. 4 is a block flow diagram of the key structure switching to a digital mode and an analog mode according to the disclosure.

Please refer to FIG. 1, FIGS. 2B and 2C and FIG. 4. When the user chooses to switch to the digital mode, a key cap 160 having the elastic component R is put on. The key cap 160 having the elastic component R is disposed at the scissor leg, making the elastic component R abut the membrane 120. After the key cap having the elastic component R is disposed, the sensor module 140 simultaneously detects the press stroke H1 (2.2 mm as mentioned above) of the key cap 160 relative to the membrane 120, and switch off the sensor module 140 through a switch.

When the user presses the key cap 160 downward, the elastic component R is driven to generate the non-linear deformation to squeeze the trigger button 121 of the membrane 120 to further trigger the digital control signal (which is ON signal). When the user on longer presses the key cap 160, the elasticity of the elastic component R is restored and the trigger button 121 of membrane 120 is released to further trigger the digital control signal (which is OFF signal).

Please refer to FIG. 1, FIGS. 3B and 3C and FIG. 4. When the user chooses to switch to the analog mode, the key cap 160 having the elastic component R is replaced by another key cap 160 having elastic component S, making the elastic component S abut the membrane 120. After the key cap 160 having the elastic component S is disposed, the sensor module 140 simultaneously detects the press stroke of the press stroke H2 (2.8 mm as mentioned above) of the key cap 160 relative to the membrane 120, and turns on the sensor module 140 through a switch.

When the user presses the key cap 160 downward, the elastic component S generates a linear deformation. The key cap 160 is relatively closed to the membrane 120, and further trigger a continuous analog control signal through the sensor module 140 detecting the change of the press stroke H2 (gradually smaller) of the key cap 160 relative to the membrane 120. When the user no longer press the key cap 160, the elasticity of the elastic component R is restored to make the key cap 160 gradually away from the membrane 120; meanwhile, the press stroke H2 also generates changes (gradually stronger) to trigger a continuous analog control signal.

The light detector 142 of the sensor module 140 is adapted to the receive and detect the light intensity after the light reflection to calculate the change of the press stroke H2 of the key cap, and make the light intensity transform into a corresponding analog control signal, therefore the control of difference in game may be virtually closed to reality, like the level of controlling the accelerator and brake in racing games, or the height of jump and the speed of moving of a character.

In addition, the key structure 100 of the disclosure may simulate the digital mode under the analog mode. The sensor module 140 set a middle value (1.4 mm for example) in advance. When the press stroke H2 of the key cap 160 relative to the membrane 120 is greater than the middle value of the sensor module 140, the OFF signal is triggered. When the press stroke H2 of the key cap 160 relative to the membrane 120 is smaller than the middle value of the sensor module 140, the ON signal is triggered. Therefore, the user may output the digital control signal under the analog mode without replacing the key cap repeatedly.

Figure 5A:
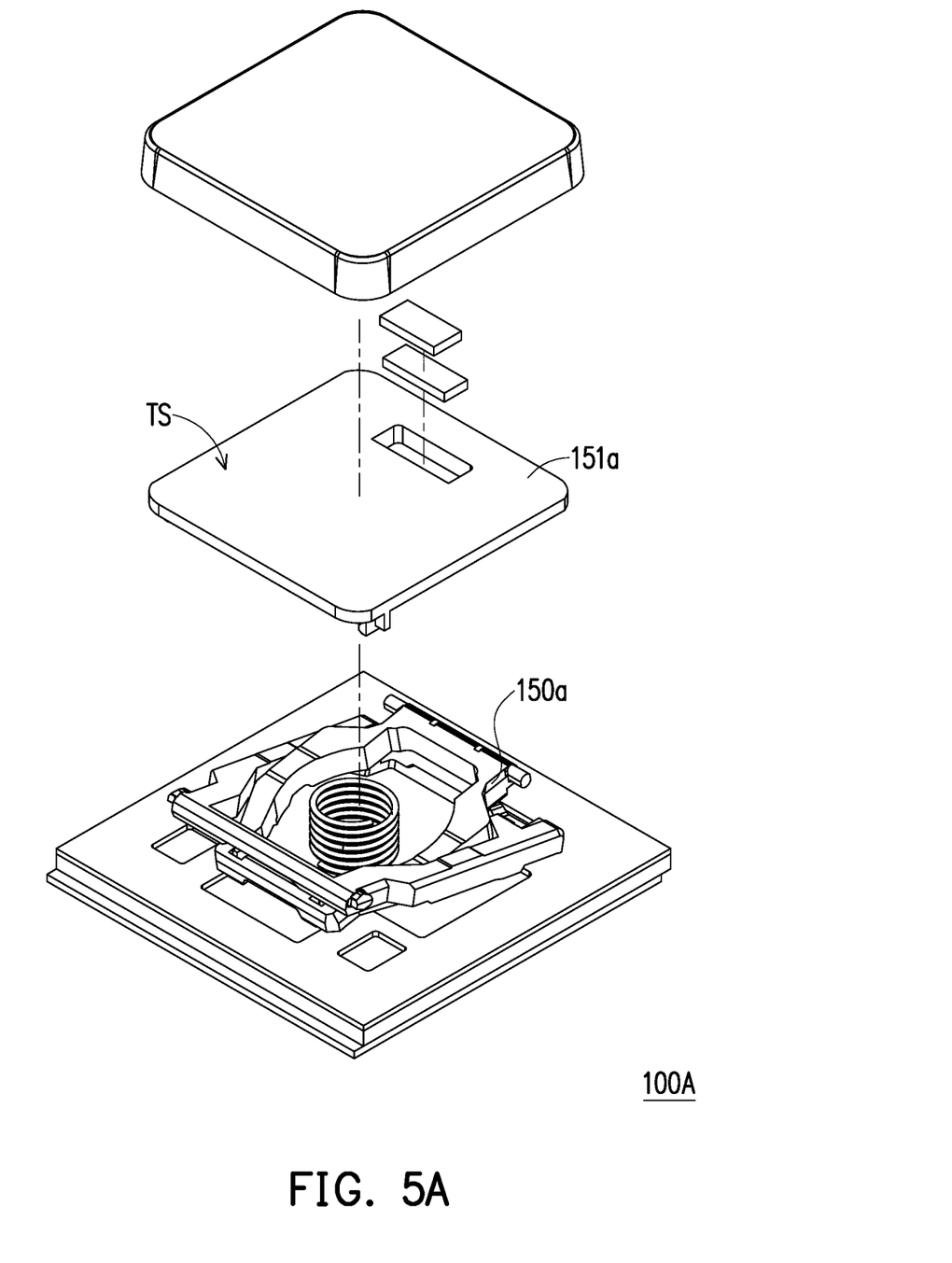
FIG. 5A is an exploded perspective view of parts of components of the key structure according to another embodiment of the disclosure.
Figure 5B:
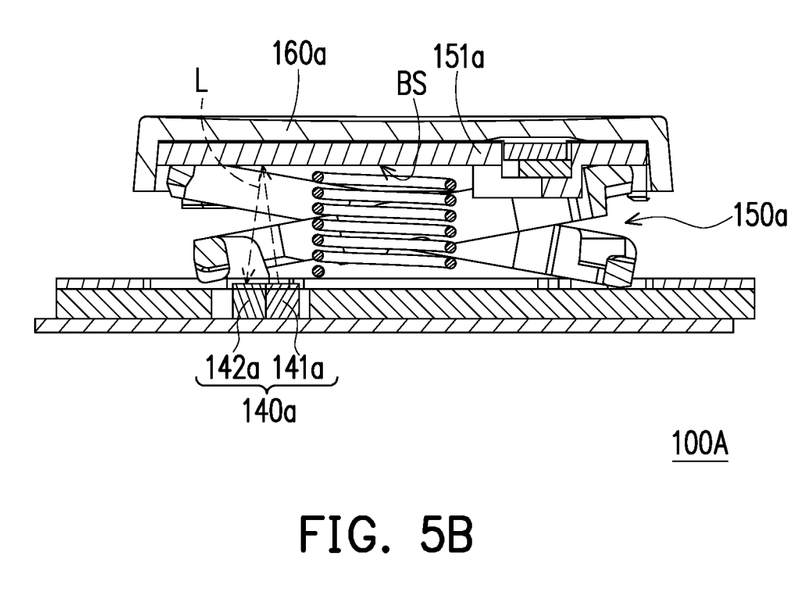
FIG. 5B is a sectional schematic view of a key structure of FIG. 5A.

FIG. 5A is an exploded perspective view of parts of components of the key structure according to another embodiment of the disclosure. FIG. 5B is a sectional schematic view of a key structure of FIG. 5A.

Please refer to FIG. 5A and FIG. 5B. The differences between the key structure 100A of the present embodiment and the key structure 100 of FIG. 2A are that the scissor leg 150a of the key structure 100A includes an installation panel 151a. The installation panel 151a covers on the sensor module 140a. To describe in detail, the light emitting device 141a of the sensor module 140a is adapted to transmit a light source L to the bottom surface BS of the installation panel 151a, and parts of the light source L is transmitted to the light detector 142a after being reflected by the bottom surface BS. Further, the key cap 160a may be detachably disposed on the top surface TS of the installation panel 151a for easy replacements of the key caps of other styles.

Summing up, the key structure of the disclosure may freely replace the key cap having different shaft components. When the user presses the key cap, the corresponding digital control signal or the analog control signal may be triggered through the membrane or the sensor module. Therefore, the key structure may be switched to the digital mode (suitable for word processing and web page browsing) and to the analog mode (suitable for electronic sports and game controlling) according to the user's requirement. Thus, compared to the keyboard of the existing notebook computer, the key structure of the disclosure has broad practicability.

Further, the key structure of the disclosure may achieve the function of switching between the digital and analog modes through only replacing the key cap; compared to the method of using an existing external analog joystick, the key structure has advantages of detachability and easy portability; also, the scenario of the incompatibility between the analog joystick and the mouse may be avoided.

Although the disclosure has been disclosed in the above embodiments, the embodiments are not intended to limit the disclosure, and those skilled in the art may make some modifications and refinements without departing from the spirit and scope of the disclosure. Therefore, the scope of the disclosure is defined by the claims attached below.

What is claimed is:

1. A key structure comprising:
   a circuit board;
   a membrane disposed on the circuit board and electrically connected to the circuit board;
   a positioning frame disposed on the membrane;
   a sensor module disposed on the membrane and electrically connected to the circuit board, wherein the sensor module is disposed at an upper surface of the circuit board and has a portion extending out of the membrane;
   a scissor leg connected to the positioning frame and adapted to move up and down relative to the positioning frame;
   a key cap detachably disposed at the scissor leg and spaced with the positioning frame, wherein the key cap has a reflective plane facing the membrane, and the sensor module is aligned with the reflective plane; and
   a shaft component, extending from the reflective plane and penetrating through the scissor leg and the positioning frame to abut the membrane,
   wherein the sensor module is adapted to detect a press stroke of the key cap relative to the membrane, and when the key cap is pressed, a digital control signal or an analog control signal is triggered through the membrane or the sensor module,
   the shaft component is an elastic component abutting the membrane and the reflective plane respectively and being adjacent to the sensor module and when the key cap is pressed towards the positioning frame, the elastic component is driven to generate a linear deformation, and an initial value of a press stroke of the key cap relative to the membrane is 2.8 mm.

2. A key structure comprising:
   a circuit board;
   a membrane disposed on the circuit board and electrically connected to the circuit board;
   a positioning frame disposed on the membrane;
   a sensor module disposed on the membrane and electrically connected to the circuit board, wherein the sensor module is disposed at an upper surface of the circuit board and has a portion extending out of the membrane;
   a scissor leg connected to the positioning frame and adapted to move up and down relative to the positioning frame;
   a key cap detachably disposed at the scissor leg and spaced with the positioning frame, wherein the key cap has a reflective plane facing the membrane, and the sensor module is aligned with the reflective plane; and
   a shaft component, extending from the reflective plane and penetrating through the scissor leg and the positioning frame to abut the membrane,
   wherein the sensor module is adapted to detect a press stroke of the key cap relative to the membrane, and when the key cap is pressed, a digital control signal or an analog control signal is triggered through the membrane or the sensor module, and
   the shaft component is adapted to squeeze the membrane and to generate a deformation, and the shaft component comprises an elastic component abutting the membrane and the reflective plane respectively and being adjacent to the sensor module, and when the key cap is pressed towards the positioning frame, the elastic component is driven a generate non-linear deformation, and an initial value of a press stroke of the key cap relative to the membrane is 2.2 mm.

3. The key structure according to claim 2, wherein the sensor module comprises a light emitting device and a light detector, and the light emitting device is adapted to transmit a light source to the reflective plane, and the light source is transmitted to the light detector after the reflection, and the light detector is adapted to receive and detect the light intensity after the reflection of the light source.

4. The key structure according to claim 2, wherein the positioning frame has a plurality of hook portions, and the key cap has a plurality of clamp portions, and the plurality of hook portions hook up one end of the scissor leg which is away from the key cap, and the plurality of clamp portions clamp the other end of the scissor leg which is away from the positioning frame.

5. The key structure according to claim 2, wherein the key cap has a plurality of fixed portions disposed on a central position of the reflective plane, and the shaft component and the plurality of fixed portions are engaged with each other.

6. The key structure according to claim 2, wherein the positioning frame has a plurality of holes corresponding to the reflective plane of the key cap and containing the shaft component and the sensor module.

7. The key structure according to claim 2, wherein the scissor leg comprises an installation panel covering the sensor module, and the key cap is detachably disposed on the installation panel.

* * * * *